(12) United States Patent
Kumar et al.

(10) Patent No.: US 9,009,008 B2
(45) Date of Patent: Apr. 14, 2015

(54) SYSTEM AND METHOD FOR AUTOMATIC GENERATION AND USAGE OF FLUID FLOW LOSS COEFFICIENTS FOR T-JUNCTIONS

(75) Inventors: Sunil Kumar, Bangalore (IN); Vikram Mangat, Bangalore (IN)

(73) Assignee: Airbus Engineering Centre India, Bangalore, Karnataka (IN)

( * ) Notice: Subject to any disclaimer, the term of this patent is extended or adjusted under 35 U.S.C. 154(b) by 428 days.

(21) Appl. No.: 13/479,324

(22) Filed: May 24, 2012

(65) Prior Publication Data
US 2012/0303345 A1 Nov. 29, 2012

(30) Foreign Application Priority Data
May 24, 2011 (IN) .......................... 1750/CHE/2011

(51) Int. Cl.
*G06F 17/50* (2006.01)
(52) U.S. Cl.
CPC ................................ *G06F 17/5018* (2013.01)
(58) Field of Classification Search
CPC .................................................. G06E 17/5018
USPC ............................................................ 703/2
See application file for complete search history.

(56) References Cited

U.S. PATENT DOCUMENTS

2007/0239345 A1* 10/2007 Bizub ............................ 701/114
2011/0093243 A1* 4/2011 Tawhai et al. ...................... 703/2

OTHER PUBLICATIONS

Andrew T. Lethander, Karen A. Thole, Gary Zess, Joel Wagner, "Vane-Endwall Junction Optimization to Reduce Turbine Vane Passage Adiabatic Wall Temperatures"; Journal of Propulsion and Power, vol. 20, No. 6, Nov.-Dec. 2004; pp. 1105-1116.*

Chris C. Kiser, Tim. A. Handy, Evan C. Lemley, Dimitrios V. Papavassiliou, Henry J. Neeman, "Renolds Number Dependence for Laminar Flow Loss Corfficients in Tee and Wye Junctions" Proceedings of the ASME 2010, Aug. 1-5, 2010, pp. 341-247.*

Paal et al., "The Effect of Corner Radius on the Energy Loss in 90° T-. Junction Turbulent Flows," Available on-line at http://paginas.fe.up.pt/~fpinho/pdfs/IF_04_paalFinalVersion.pdf.

Vasava "Fluid Flow in T-Junction of Pipes," Available on-line at http://www.doria.fi/bitstream/handle/10024/39713/nbnfi-fe200808041754.pdf?sequence=4.

Bassett et al., "Calculation of steady flow pressure loss coefficients for pipe junctions," Proceedings of the Institution of Mechanical Engineers, Part C: Journal of Mechanical Engineering Science Aug. 1, 2001 vol. 215 No. 8 861-881 Abstract available on-line at http://pic.sagepub.com/content/215/8/861.abstract.

* cited by examiner

*Primary Examiner* — Dwin M Craig
(74) *Attorney, Agent, or Firm* — Prakash Nama; Global IP Services, PLLC

(57) ABSTRACT

A system and method for automatic generation and usage of fluid flow loss coefficients for T-junctions is disclosed. In one embodiment, a list of possible T-junctions is created using given geometric and flow parameters. Further, journal files are created using the geometric and the flow parameters associated with each T-junction. The journal files associated with each T-junction are pre-processed for creating a volume mesh. Boundary conditions and material properties for the volume mesh associated with each T-junction are defined. Simulation is performed using the volume mesh, the boundary conditions and the material properties associated with each T-junction to determine flow characteristics. Fluid flow loss coefficients for each T-junction are computed using the flow characteristics.

20 Claims, 7 Drawing Sheets

400

500

SYSTEM AND METHOD FOR AUTOMATIC GENERATION AND USAGE OF FLUID FLOW LOSS COEFFICIENTS FOR T-JUNCTIONS

RELATED APPLICATIONS

Benefit is claimed under 35 U.S.C. 119(a)-(d) to Indian Provisional Application Serial No. 1750/CHE/2011 entitled "SYSTEM AND METHOD FOR AUTOMATIC GENERATION AND USAGE OF FLUID FLOW LOSS COEFFICIENTS FOR T-JUNCTIONS" filed on May 24, 2011 by Airbus Engineering Centre India.

BACKGROUND

Typically, an aircraft fuel system is designed for various fluid flow scenarios that are influenced by diverse design constraints. Thereby, an aircraft fuel system designer considers scenarios ranging from tank refueling, in-flight conditions, landing and the like. Further, by coupling these operating scenarios with trade-offs that occur throughout the design and development process, the number of design decisions can grow exponentially. Therefore, an efficient method for studying and validating the numerous aircraft fuel system designs may be required to ensure quality and safety.

A typical design process for the aircraft fuel system involves studying of one-dimensional (1D) analysis of fuel system schematic networks. Complex network junctions are studied using 1D/three-dimensional (3D) coupling approach, which can be more expensive. Generally, the 1D network uses the experimental or empirical data for individual components appearing in the network. For example, an aircraft fuel system may include a plurality of T-junctions. In existing methods, loss coefficients available for the T-junctions are not sufficient in the domain studying the aircraft fuel system. Literature shows the loss coefficients of different classes (class-1, 2 and 3) in the order of the decreasing accuracy. Further, an automated module provides high quality computational fluid dynamics (CFD) results that can replace the loss coefficients with lesser accuracy (class-2, and class-3 data). Few information is available for the T-junctions in the literature by using 3D CFD codes, however the quantity of loss coefficients is very less and the results are generally, generated using a manual approach (i.e., manual geometry creation, mesh creation and simulation and post processing). Furthermore, thousands of CFD computations are required to encompass all possible configurations.

In addition, the problem in simulating the 1D network include simulation convergence, which can require, either significant time to work-around the problem or to remove the T-Junctions, thereby reducing the accuracy of the simulations. This convergence problem is partly due to the complexity of the mathematical model used in the 1D network and predominantly due to inconsistencies and/or inaccuracy in the loss coefficient surface data (f {Area Ratio, Flow Ratio}) for different flow regimes used in iterative computational methods.

FIG. 1 is a graph 100 illustrating the problematic regions in a T-junction database used in particular type of T-junction simulations of the 1D network. The solid lines illustrate experimental results with different classes (class-1, 2 and 3) in the order of the decreasing accuracy. As shown in region 102, the T-junction database lacks data in some regions, such as low area ratios and different flow regimes (i.e., symmetric combining and dividing flows). If any T-junction present in the fuel network comes across such regions, where the data is not available, it may result in the convergence problems for the network in a Flowmaster. Hence, the Flowmaster may recommend removing the T-junction; however, this may not always be possible as it can contribute to significant pressure losses in the aircraft fuel system.

BRIEF DESCRIPTION OF THE DRAWINGS

Various embodiments are described herein with reference to the drawings, wherein.

The drawings described herein are for illustration purposes only and are not intended to limit the scope of the present disclosure in any way.

DETAILED DESCRIPTION

A system and method for automatic generation and usage of fluid flow loss coefficients for T-junctions in fluid flow networks is disclosed. In the following detailed description of the embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined by the appended claims.

The present invention provides an automated tool to generate loss coefficients for T-junctions of any fuel network during the simulation using 1D tools. In the document, the term "T-junction" refers to a junction formed between a main pipe and a branch pipe in fuel system at an angle, where the angle varies from 0° to 90°.

Figure 1:
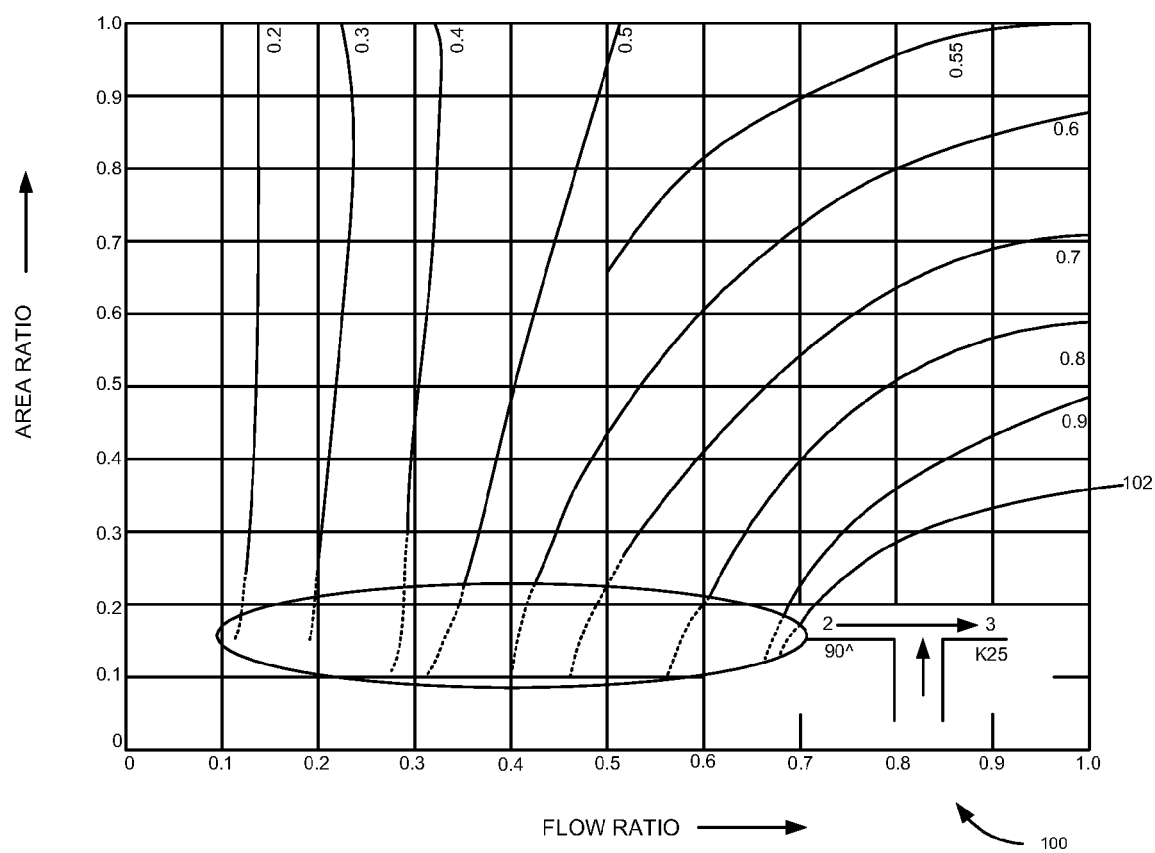
FIG. 1 shows the problematic regions in a T-junction database used in particular type of T-junctions simulations of the 1D network.
Figure 2:
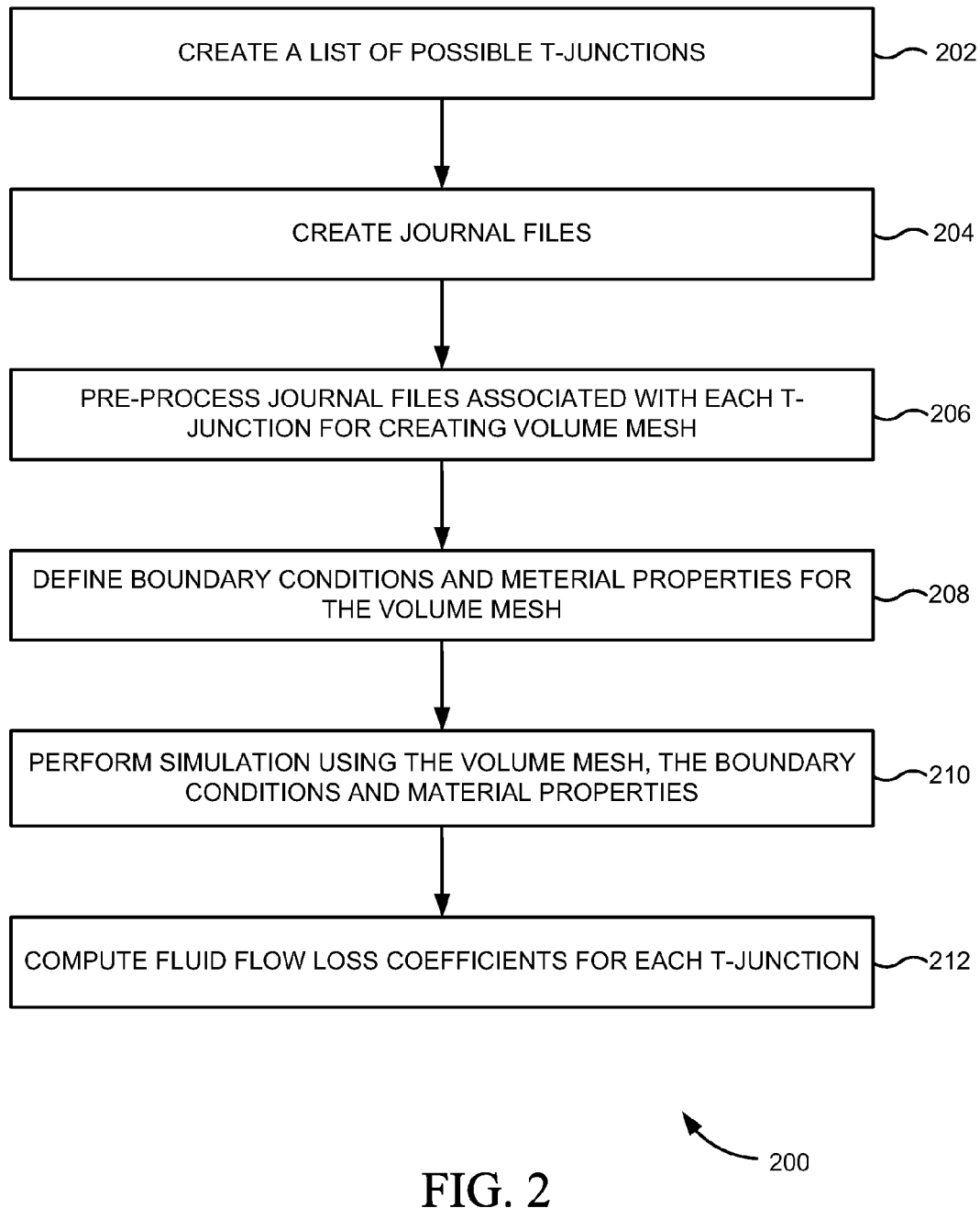
FIG. 2 illustrates a computer implemented flow diagram of a method for automatically generating and using fluid flow loss coefficients for T-junctions, according to one embodiment.
Figure 3:
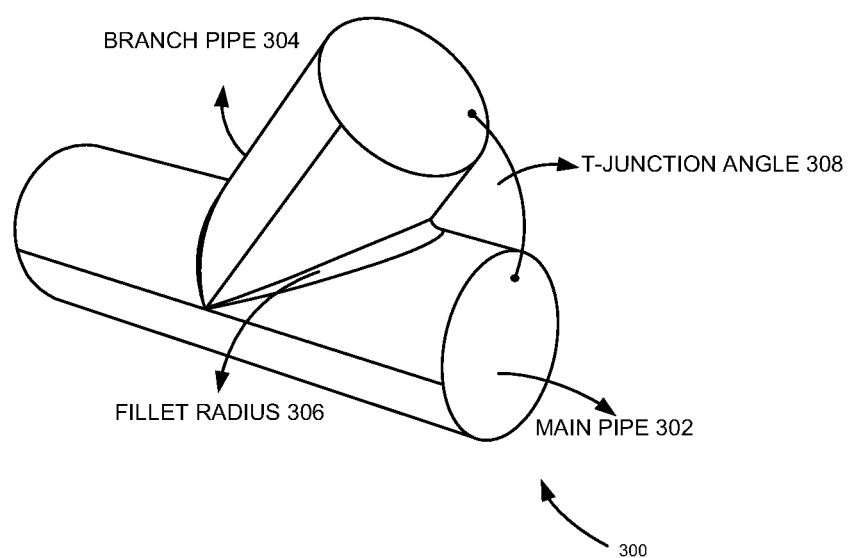
FIG. 3 is a schematic representation showing general nomenclature of the T-junctions, according to one embodiment.

FIG. 2 illustrates a computer implemented flow diagram 200 of a method for automatically generating and using fluid flow loss coefficients for T-junctions, according to one embodiment. At block 202, a list of possible T-junctions is created using given geometric and flow parameters. The geometric parameters include but not limited to a main pipe diameter, a branch pipe diameter, an area ratio, a fillet radius and a T-junction angle, which are shown in FIGS. 3-4. The flow parameters include but not limited to flow configurations and flow ratios which are shown in FIG. 5.

For example, the possible T-junctions are located in fluid flow networks including but not limited to aircraft fuel flow networks, hydraulic networks, and/or pneumatic networks. At block 204, journal files are created using the geometric and the flow parameters associated with each T-junction.

At block 206, the journal files associated with each T-junction are pre-processed for creating a volume mesh. In these embodiments, a geometric mesh and a surface mesh for each T-junction are created. Further, the volume mesh is created by using the geometric mesh and the surface mesh created for each T-junction. At block 208, boundary conditions and material properties are defined for the volume mesh associated with each T-junction. At block 210, simulation is performed using the volume mesh, the boundary conditions and the material properties associated with each T-junction to determine flow characteristics. The flow characteristics include but not limited to pressure profiles, velocity profiles, friction profiles, and/or turbulence parameter profiles.

At block 212, fluid flow loss coefficients are computed for each T-junction using the flow characteristics. Further, the computed fluid flow loss coefficients are stored in a fluid flow loss co-efficient database. For example, the fluid flow loss co-efficient database may be a 1D fluid flow solver output file.

Furthermore, the fluid flow loss coefficients stored in the database are used during run time by the 1D fluid flow solver for analyzing fluid flow networks. Also, the fluid flow loss coefficient database is dynamically updated with fluid flow loss coefficients computed using the above steps when new T-junctions having different geometric and flow parameters are required by the fuel flow networks.

FIG. 3 is a schematic representation 300 showing general nomenclature of a T-junction, according to one embodiment. Particularly, the T-junction includes a main pipe 302, a branch pipe 304, a fillet radius 306, and a T-junction angle 308. The T-junction angle 308 refers to an angle between the main pipe 302 and the branch pipe 304. The fillet radius 306 refers to a radius of a concave easing formed at the junction of the main pipe 302 and the branch pipe 304. The possible list of T-junctions with different geometric parameters is shown in FIGS. 4A-D.

FIGS. 4A-D illustrate exemplary T-junctions 400 with different geometric parameters that are mostly used in aircraft fuel flow networks. In one embodiment, the present technique can model all the T-junction configurations shown in FIGS. 4A-D.

Figure 4A:
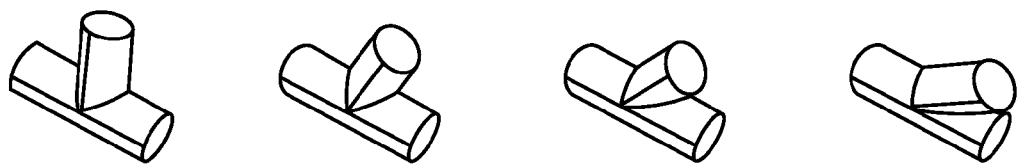
FIGS. 4A-D illustrate exemplary T-junctions with different geometric parameters that are mostly used in aircraft fuel flow networks.
Figure 4B:
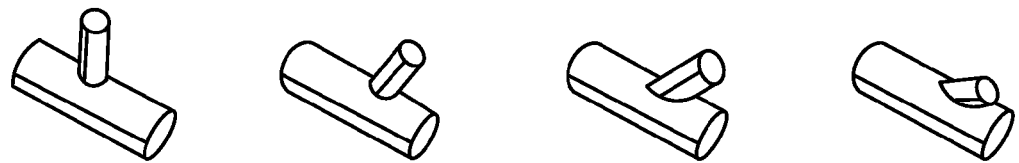

FIG. 4A illustrates an angled T-junction without fillet radius and having an area ratio of 1 (i.e., area of a main pipe is equal to the area of a branch pipe). Area ratio is defined as the ratio of the branch pipe/area of the main pipe and varies from 0 to 1. FIG. 4B illustrates an angled T-junction without fillet radius and having an area ratio less than 1 (i.e., area of the main pipe is greater than the area of the branch pipe).

Figure 4C:
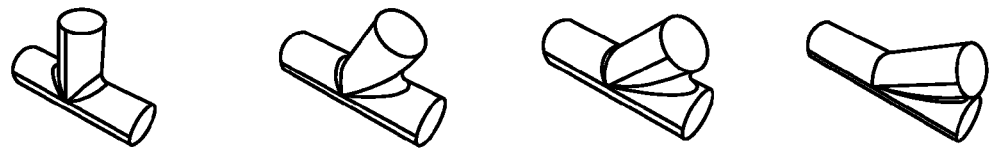
Figure 4D:

FIG. 4C illustrates an angled T-junction with fillet radius and having an area ratio of 1. FIG. 4D illustrates an angled T-junction with fillet radius and having an area ratio less than 1 (i.e., area of the main pipe is greater than the area of the branch pipe).

FIGS. 5A-F illustrate exemplary T-junctions 500 with different flow parameters, which are mostly used in aircraft fuel flow networks. In one embodiment, the present technique can model all the T-junction flow configurations shown in FIGS. 5A-F.

Figure 5A:
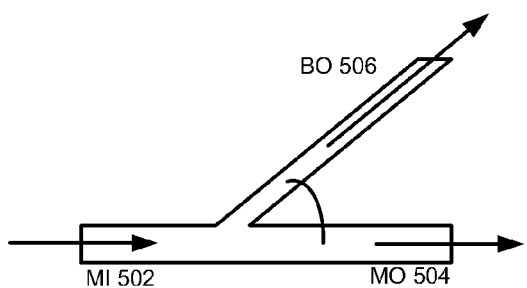
FIGS. 5A-F illustrate exemplary T-junctions with different flow parameters, which are mostly used in aircraft fuel flow networks.

FIG. 5A illustrates a flow regime of a T-junction in forward dividing configuration. Particularly, FIG. 5A illustrates a main inlet 502, a main outlet 504, and a branch outlet 506. The naming conventions for all flow regimes (i.e., FIGS. 5A-F) are kept same and only the boundary types are changed during the simulation. Further, the main inlet 502 and the main outlet 504 are associated with the main pipe (e.g., the main pipe 302 of FIG. 3) and the branch outlet 506 is associated with a branch pipe (e.g., the branch pipe 304 of FIG. 3). In the forward dividing configuration, the fluid (e.g., fuel) flows from the main inlet 502 to the main outlet 504 and the branch outlet 506 of the T-junction as shown in FIG. 5A.

Figure 5B:
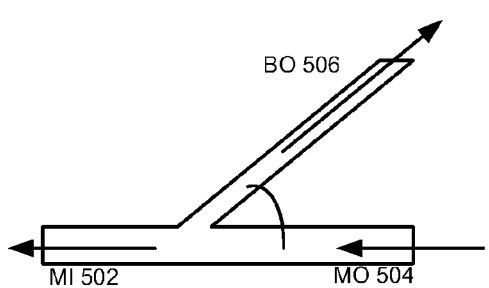
Figure 5C:
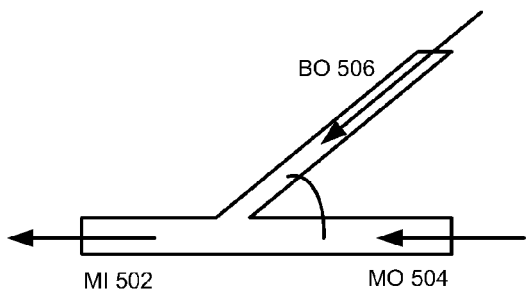

FIG. 5B illustrates a flow regime of a T-junction in backward dividing configuration, where the fluid enters the T-junction from the main outlet 504 and leaves the T-junction at the main inlet 502 and the branch outlet 506. FIG. 5C illustrates a flow regime of a T-junction in forward combining configuration, where the fluid enters the T-junction from the main outlet 504 and the branch outlet 506 and leaves the T-junction at the main inlet 502.

Figure 5D:
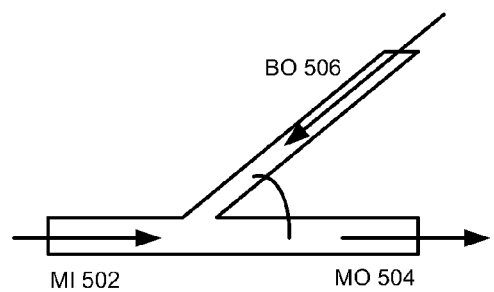
Figure 5E:
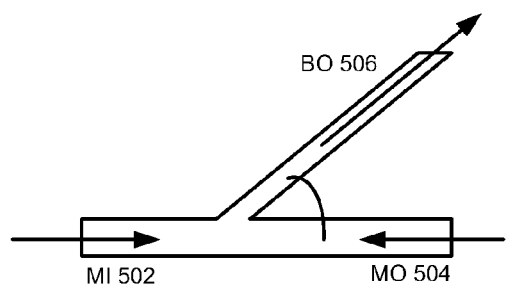
Figure 5F:
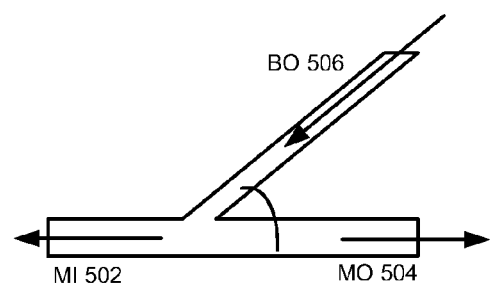

FIG. 5D illustrates a flow regime of a T-junction in backward combining configuration, where the fluid enters the T-junction from the main inlet 502 and the branch outlet 506 and leaves the T-junction at the main outlet 504. FIG. 5E illustrates a flow regime of a T-junction in symmetric combining configuration, where the fluid enters the T-junction from the main inlet 502 and the main outlet 504 and leaves the T-junction at the branch outlet 506. Similarly, FIG. 5F illustrates a flow regime of a T-junction in symmetric dividing configuration, where the fluid enters the T-junction from the branch outlet 506 and leaves the T-junction at the main inlet 502 and the main outlet 504.

Figure 6:
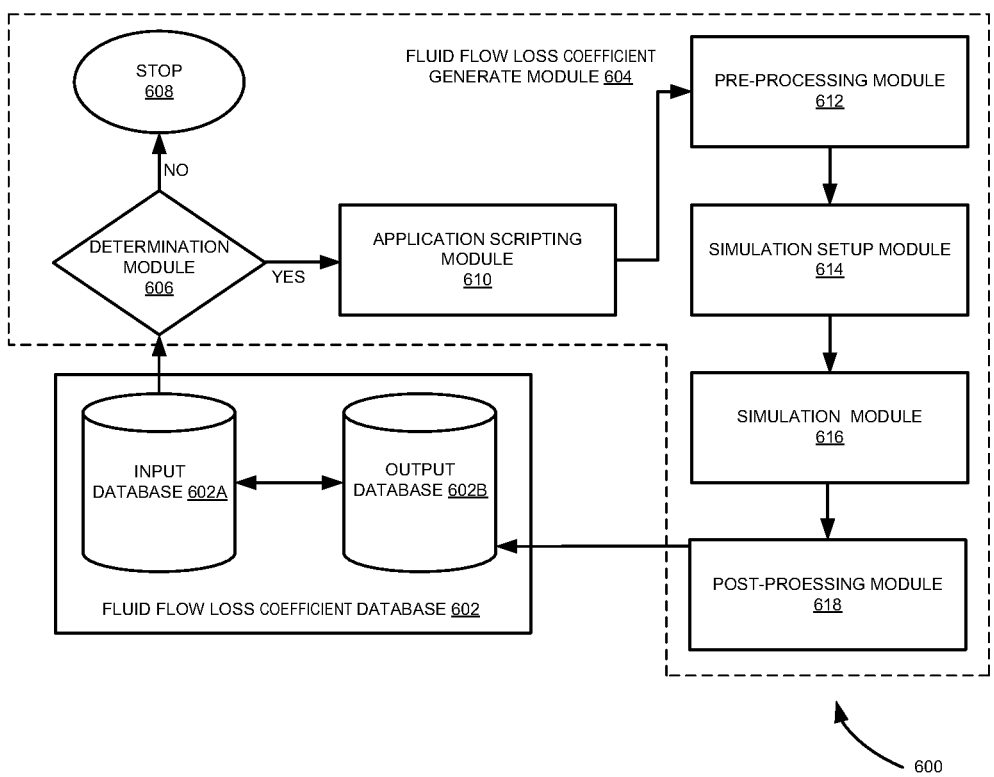
FIG. 6 illustrates a block diagram 600 for automatically generating fluid flow loss coefficients for T-junctions, according to one embodiment.

FIG. 6 illustrates a block diagram 600 for automatically generating fluid flow loss coefficients for T-junctions, according to one embodiment. Particularly, FIG. 6 illustrates a fluid flow loss coefficient generation module 604 communicatively coupled to a fluid flow loss coefficient database 602.

As shown in FIG. 6, the fluid flow loss coefficient database 602 includes an input database 602 and an output database 602B. Exemplary fluid flow loss coefficient database 602 includes a station, where the input and output data for which the fluid flow loss coefficients are required is stored. In one example embodiment, the input database 602A contains the input data such as geometric and flow parameters associated with the list of T-junctions and the output database 602B stores respective fluid flow loss coefficients associated with each T-junction.

Exemplary geometric parameters include a main pipe diameter, a branch pipe diameter, a T-junction angle, and a fillet radius, and exemplary flow parameters include flow configuration and flow ratio. In one example embodiment, the geometric parameters determine the shape of the T-junction and the flow parameters determine the flow regime under which the T-junction is operating.

In one embodiment, the fluid flow loss coefficient generation module 604 automatically generates fluid flow loss coefficients for T-junctions using scripts for individual software for performing pre-processing, simulation, and post-processing. This automation process can be controlled in an application environment. As shown in FIG. 6, the fluid flow loss coefficient generation module 604 includes a determination module 606, an application scripting module 610, a pre-processing module 612, a simulation setup module 614, a simulation module 616, and a post-processing module 618.

In operation, the determination module 606 determines whether the fluid flow loss coefficients are computed for all the requested list of T-junctions. If the fluid flow loss coefficients are computed for all the requested list of T-junctions, then the determination module terminates the process of generating the fluid flow loss coefficients as shown in block 608. If the fluid flow loss coefficients are not computed for all the requested list of T-junctions, then the application scripting module 610 reads the geometric and the flow parameters associated with the T-junction from fluid flow loss coefficient database and modifies the pre-processing, simulation and post-processing input files accordingly.

Further in operation, upon modifying the input files, the master application initiates the sub-processes to modify the pre-processing, simulation and post-processing journal files. In these embodiments, the application scripting module 610 runs application scripts with new T-junction input files for modifying the pre-processing, simulation and post-processing journal files.

Furthermore in operation, the pre-processing module 612 creates a geometric mesh and a surface mesh for each T-junction, and then creates a volume mesh using the geometric mesh and the surface mesh. In one example embodiment, the surface mesh can be generated using GAMBIT2.4.6 and the volume mesh can be generated using the commercial unstructured mesh generator Tgrid5.0. Then, the volume mesh refinement is performed.

The volume mesh refinement process involves creating the "refinement zones" close to the T-junction. The volume mesh refinement is then performed on these refinement zones with successively lower size mesh. Smoothing and swapping (i.e., improve) operations between the successive refinements ensures the mesh skewness is within the permissible limits. For example, the surface mesh skewness should be below 0.6 (Fluent-Tgrid criteria) and the volume mesh skewness should be below 0.8 (Fluent-Tgrid criteria) for production of good quality results. Once the mesh satisfies the entire mesh quality criterion, the ends of the mesh are extruded for creating the rest of the domain.

Further, the simulation setup module 614 defines boundary conditions and material properties for the volume mesh associated with each T-junction. The simulation module 616 performs simulation using the volume mesh, the boundary conditions and the material properties associated with each T-junction to determine flow characteristics and to obtain convergence. Exemplary flow characteristics include at least one of pressure profiles, velocity profiles, friction profiles, and turbulence parameter profiles. In these embodiments, the simulation module 616 observes consistency of monitors in addition to residual drop in order to ensure the convergence of solutions. For example, the monitors consist of some point monitors and intermediate surface monitors, and the locations of monitors are presented with respect to "Centre of T-junction (CT)".

In addition, the post-processing module 618 computes fluid flow loss coefficients for each T-junction using the flow characteristics. As mentioned above, the fluid flow loss coefficients are stored in output database 602B of the fluid flow loss coefficient database 602. The post-processing module 618 also checks the quality of the results. The following description is intended to provide a brief, general description of a suitable computing environment in which certain embodiments of the inventive concepts contained herein may be implemented.

Figure 7:
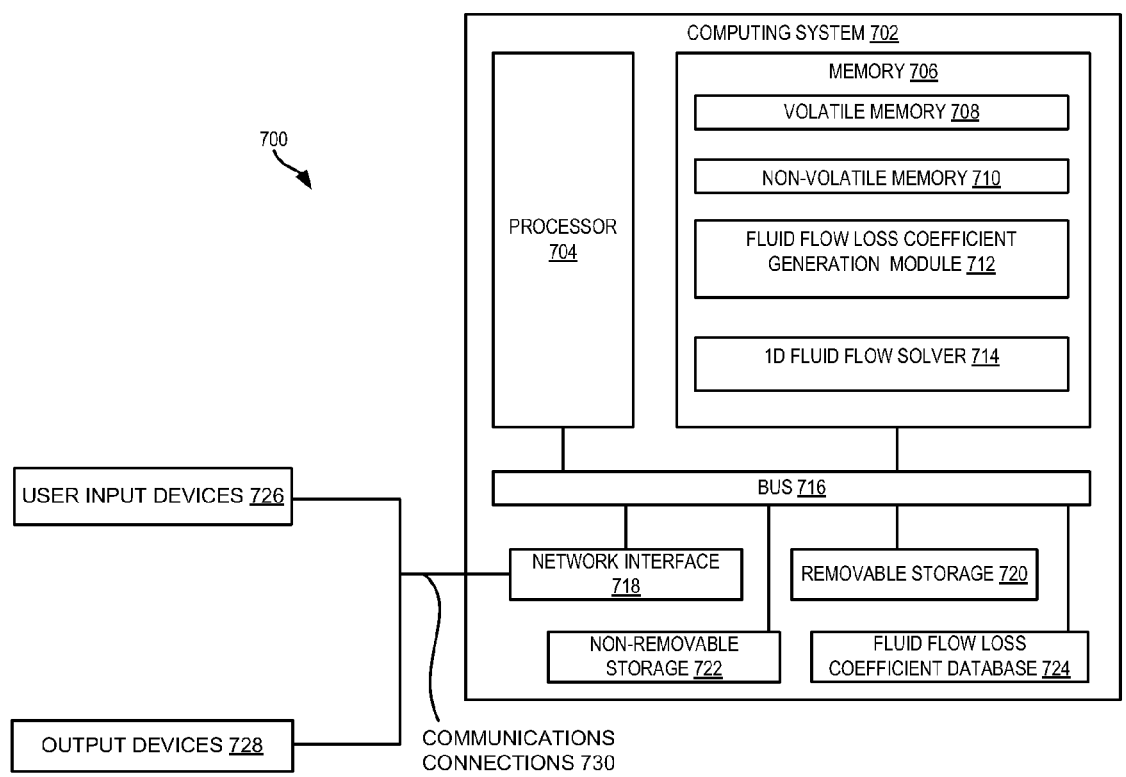
FIG. 7 is a diagrammatic system view 700 of a data processing system in which any of the embodiments disclosed herein may be performed, according to one embodiment.

FIG. 7 is a diagrammatic system view 700 of a data processing system in which any of the embodiments disclosed herein may be performed, according to one embodiment. Particularly, FIG. 7 illustrates a general computing system 702, in the form of a personal computer or a mobile device may include a processor 704, memory 706, a removable storage 720, and a non-removable storage 722. The computing system 702 additionally includes a bus 716, a network interface 718 and a fluid flow loss coefficient database 724. The computing system 702 may include or have access to user input devices 726 and one or more output devices 728 via one or more communication connections 730 such as a network interface card or a universal serial bus connection.

The one or more user input devices 726 may be a digitizer screen and a stylus, trackball, keyboard, keypad, mouse, and the like. The one or more output devices 728 may be a display device of the personal computer for showing the performance/simulation results. The communication connections 840 may include a local area network, a wide area network, and/or other networks.

The memory 706 may include volatile memory 708 and non-volatile memory 710. A variety of computer-readable storage media may be stored in and accessed from the memory elements of the computing system 702, such as the volatile memory 708 and the non-volatile memory 710, the removable storage 720 and the non-removable storage 722. Computer memory elements may include any suitable memory device(s) for storing data and machine-readable instructions, such as read only memory, random access memory, erasable programmable read only memory, electrically erasable programmable read only memory, hard drive, removable media drive for handling compact disks, digital video disks, diskettes, magnetic tape cartridges, memory cards, Memory Sticks™, and the like.

The processor 704, as used herein, means any type of computational circuit, such as, but not limited to, a microprocessor, a microcontroller, a complex instruction set computing microprocessor, a reduced instruction set computing microprocessor, a very long instruction word microprocessor, an explicitly parallel instruction computing microprocessor, a graphics processor, a digital signal processor, or any other type of processing circuit. The processor 704 may also include embedded controllers, such as generic or programmable logic devices or arrays, application specific integrated circuits, single-chip computers, smart cards, and the like.

Embodiments of the present subject matter may be implemented in conjunction with program modules, including functions, procedures, data structures, and application programs, for performing tasks, or defining abstract data types or low-level hardware contexts. Machine-readable instructions stored on any of the above-mentioned storage media may be executable by the processor 704 of the computing system 702. For example, a computer program (residing in the memory) may include machine-readable instructions capable of generating and using fluid flow loss coefficients for T-junctions, according to the teachings and herein described embodiments of the present subject matter. In one embodiment, the computer program may be included on a compact disk-read only memory (CD-ROM) and loaded from the CD-ROM to a hard drive in the non-volatile memory 710. The machine-readable instructions may cause the computing system 702 to encode according to the various embodiments of the present subject matter.

As shown, the memory includes a fluid flow loss coefficient generation module 712 (similar to fluid flow loss coefficient generation module 604 of FIG. 6) and a 1D fluid flow solver 714. The fluid flow loss coefficient generation module 712 and the 1D fluid flow solver 714 are operable to perform the above described method.

For example, the fluid flow loss coefficient generation module 712 and the 1D fluid flow solver 714 may be in the form of instructions stored on a non-transitory computer-readable storage medium. The non-transitory computer-readable storage medium having the instructions that, when executed by the computing system 702, may cause the computing system 702 to perform one or more methods described in FIGS. 1 through 7.

In accordance with the above described embodiments, the T-junction details are manually extracted from the input database 602A (of the fluid flow loss coefficient database 601) and inputted to gambit for CAD generation and surface mesh generation. Further, the surface mesh generation gambit exports a mesh file, which can be inputted to Tgrid manually. Once the volume mesh is generated, the mesh file can be inputted to fluent manually where the case setup, simulation, and post processing are performed automatically through scripts. In this case, all the individual processes are automated using the scripts, which need to be modified manually before the process of automatically generating fluid flow loss coefficients for T-junctions starts, (i.e., before providing the list of possible T-junctions to the determination module 606). In other words, the user may only needs to give the inputs, which is the list of T-junctions parameters (i.e., geometric and flow parameters) and at the end user gets the output as surface data for the corresponding flow ratios and area ratios.

Furthermore, the automating the pre-processing, simulation and post processing is explained as follows. The T-junction is divided into four parts, where the first part includes validation of CFD model using the available experimental results. The second part includes modeling of symmetric T-junctions, for example, includes the 90-degree junction with sharp edges. In this case, the main pipe diameter may vary from 1.0'-4.5' and the branch pipe diameter varies from 0.5'-3.0'. The third part includes the modeling of T-junctions with different T-junction angles. The fourth (i.e., the final part) includes modeling of the T-junction with combination of all above features (i.e., 90°-T-junction, different angled T-junction, and fillet radius). In one embodiment, all the scripts created for automation are generalized scripts, which work for all possible configurations of the T-junction shown in FIGS. 4-5. For example, the scripts created for performing complete automation of T-junctions include but not limited to a Gambit Script, Tgrid Script, Fluent Script, Run List Script, and/or Post Processing Script.

An article comprising a computer readable storage medium having instructions thereon which when executed by a computing platform result in execution of the above mentioned method. The method described in the foregoing may be in a form of a machine-readable medium embodying a set of instructions that, when executed by a machine, causes the machine to perform any method disclosed herein. It is appreciated that the various embodiments discussed herein may not be the same embodiment, and may be grouped into various other embodiments not explicitly disclosed herein.

In addition, it is appreciated that the various operations, processes, and methods disclosed herein may be embodied in a machine-readable medium and/or a machine accessible medium compatible with a data processing system (e.g., a computer system), and may be performed in any order (e.g., including using means for achieving the various operations). Accordingly, the specification and drawings are to be regarded in an illustrative rather than a restrictive sense.

In various embodiments, the methods and systems described in FIGS. 1 through 7 may enable a mesh convergence technique having an increased accuracy and reduced simulation run time. One can envision using the above mentioned techniques for high density components also.

Although the present embodiments have been described with reference to specific example embodiments, it is be evident that various modifications and changes may be made to these embodiments without departing from the broader spirit and scope of the various embodiments. Furthermore, the various devices, modules, analyzers, generators, and the like described herein may be enabled and operated using hardware circuitry, for example, complementary metal oxide semiconductor based logic circuitry, firmware, software and/or any combination of hardware, firmware, and/or software embodied in a machine readable medium. For example, the various electrical structure and methods may be embodied using transistors, logic gates, and electrical circuits, such as application specific integrated circuit.

What is claimed is:

1. An automated method of generating and using fluid flow loss coefficients for T-junctions in fluid flow networks, comprising:
    creating a list of possible T-junctions using given geometric and flow parameters;
    creating, ournal files using the geometric and the flow parameters associated with each T-junction;
    pre-processing the journal files associated with each T-junction for creating a volume mesh;
    defining boundary conditions and material properties for the volume mesh associated with each T-junction;
    performing simulation using the volume mesh, the boundary conditions and the material properties associated with each T-junction to determine flow characteristics; and
    computing the fluid flow loss coefficients for each T-junction using the flow characteristics.

2. The method of claim 1, further comprising:
    storing the computed fluid flow loss coefficients in a fluid flow loss co-efficient database.

3. The method of claim 2, further comprising:
    using the stored fluid flow loss coefficients during run time by a 1D fluid flow solver for analyzing the fluid flow networks.

4. The method of claim 3, further comprising:
    dynamically updating the fluid flow loss coefficient database with fluid flow loss coefficients computed using the steps of claim 1 when new T-junctions having different geometric and flow parameters are required by the fluid flow networks.

5. The method of claim 3, wherein the fluid flow networks comprise networks selected from the group consisting of aircraft fuel flow networks, hydraulic networks, and pneumatic networks.

6. The method of claim 1, wherein the geometric parameters comprise a main pipe diameter, a branch pipe diameter, an area ratio, a fillet radius and a T-junction angle.

7. The method of claim 1, wherein the flow parameters comprise flow configurations and flow ratios.

8. The method of claim 1, wherein creating the volume mesh comprises:
    creating a geometric mesh for each T-junction;
    creating a surface mesh for each T-junction; and
    creating the volume mesh using the geometric mesh and the surface mesh.

9. The method of claim 1 wherein the flow characteristics comprise at least one of pressure profiles, velocity profiles, friction profiles, and turbulence parameter profiles.

10. A system for generating and using fluid flow loss coefficients for T-junctions in fluid flow networks, comprising:
    a fluid flow loss coefficient database;
    a processor communicatively coupled to the fluid flow loss coefficient database; and
    memory coupled to the processor, wherein the memory includes:
        a fluid flow loss coefficient generation module to:
            create a list of possible T-junctions using given geometric and flow parameters;

create journal files using the geometric and the flow parameters associated with each T-junction;

pre-process the journal files associated with each T-junction for creating a volume mesh:.

define boundary conditions and material properties for the volume mesh associated with each T-junction;

perform simulation using the volume mesh, the boundary conditions and the material properties associated with each T-junction to determine flow characteristics;

compute the fluid flow loss coefficients for each T-junction using the flow characteristics; and store the computed fluid flow coefficients in the fluid flow coefficient database.

11. The system of claim 10, wherein the memory further includes a 1 D fluid flow solver to analyze the fluid flow networks using the stored fluid flow loss coefficients during run time.

12. The system of claim 11, wherein the fluid flow loss co-efficient database is dynamically updated with fluid flow loss coefficients computed for new T-junctions when the new T-junctions having different geometric and flow parameters are required by the fluid flow networks.

13. The system of claim 11, wherein the fluid flow networks comprise networks selected from the group consisting of aircraft fuel flow networks, hydraulic networks, and pneumatic networks.

14. The system of claim 10, wherein the geometric parameters comprise a main pipe diameter, a branch pipe diameter, an area ratio, a fillet radius and a T-junction angle.

15. The system of claim 10, wherein the flow parameters comprise flow configurations and flow ratios.

16. A non-transitory computer-readable storage medium for generating and using fluid flow loss coefficients for T-junctions in fluid flow networks having instructions that, when executed by a computing device, cause the computing device to:

create a list of possible T-junctions using given geometric and flow parameters;

create journal files using the geometric and the flow parameters associated with each T-junction;

pre-process the journal files associated with each T-junction for creating a volume mesh;

define boundary conditions and material properties for the volume mesh associated with each T-junction;

perform simulation using the volume mesh the boundary conditions and the material properties associated with each T-junction to determine flow characteristics; and compute the fluid flow loss coefficients for each T-junction using the flow characteristics.

17. The non-transitory computer-readable storage medium of claim 16, further comprising instructions to:

store the computed fluid flow loss coefficients in a fluid floe loss co-efficient database.

18. The non-transitory computer-readable storage medium of claim 17, further comprising instructions to:

use the stored fluid flow loss coefficients during run time by a 1 D fluid flow solver for analyzing the fluid flow networks.

19. The non-transitory computer-readable storage medium of claim 18, further comprising instructions to:

dynamically update the fluid flow loss coefficient database with fluid flow loss coefficients computed using the steps of claim 16 when new T-junctions having different geometric and flow parameters are required by the fluid flow networks.

20. The non-transitory computer-readable storage medium of claim 18, wherein the fluid flow networks comprise networks selected from the group consisting of aircraft fuel flow networks, hydraulic networks, and pneumatic networks.

* * * * *